(12) United States Patent
Kubena et al.

(10) Patent No.: US 6,975,009 B2
(45) Date of Patent: Dec. 13, 2005

(54) DUAL-WAFER TUNNELING GYROSCOPE AND AN ASSEMBLY FOR MAKING SAME

(75) Inventors: Randall L. Kubena, Oak Park, CA (US); David T. Chang, Covina, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 10/853,848

(22) Filed: May 25, 2004

(65) Prior Publication Data

US 2004/0217388 A1 Nov. 4, 2004

Related U.S. Application Data

(62) Division of application No. 10/223,874, filed on Aug. 19, 2002, which is a division of application No. 09/629,679, filed on Aug. 1, 2000, now Pat. No. 6,555,404.

(51) Int. Cl.[7] .............................................. H01L 29/82
(52) U.S. Cl. ..................... 257/417; 257/414; 257/415; 257/587; 438/22; 438/48
(58) Field of Search ................. 257/414–420; 438/52–53, 22

(56) References Cited

U.S. PATENT DOCUMENTS

| | | | |
|---|---|---|---|
| 5,015,850 A | 5/1991 | Zdeblick et al. | ............ 250/306 |
| 5,210,714 A | 5/1993 | Pohl et al. | .................. 365/157 |

(Continued)

FOREIGN PATENT DOCUMENTS

| | | |
|---|---|---|
| DE | 43 05 033 | 10/1993 |
| EP | 0 619 495 | 10/1994 |
| JP | 04-369418 | 12/1992 |
| JP | 08-203417 | 8/1996 |
| WO | 97/10698 | 3/1997 |

OTHER PUBLICATIONS

U.S. Appl. No. 10/358,471, filed Feb. 4, 2003, Kubena et al.
U.S. Appl. No. 10/370,124, filed Feb. 18, 2003, Kubena et al.
U.S. Appl. No. 10/429,988, filed May 6, 2003, Kubena et al.
U.S. Appl. No. 10/639,289, filed Aug. 11, 2003, Kubena et al.
Abstract of JP 04–369418, *Patent Abstracts of Japan*, vol. 017, No. 250, May 18, 1993.
Abstract of JP 08–203417, *Patent Abstracts of Japan*, vol. 1996, No. 12, Dec. 26, 1996.
Cheng, Y.T. and Khalil Najafi, "Localized Silicon Fusion and Eutectic Bonding for MEMS Fabrication and Packaging", *Journal of Microelectromechanical Systems*, vol. 9, No. 1, pp. 3–8 (Mar. 2000).
Liu, C–H, et al., "Characterization of a High–Sensitivity Micromachined Tunneling Accelerometer with Micro–g Resolution", *Journal of Microelectromechanical Systems*, vol. 7, No. 2, pp. 235–243 (Jun. 1998).

(Continued)

*Primary Examiner*—Dung A. Le
(74) *Attorney, Agent, or Firm*—Ladas & Parry LLP (57) ABSTRACT

A MEM tunneling gyroscope assembly includes (1) a beam structure, and a mating structure defined on a first substrate or wafer; and (2) at least one contact structure, and a mating structure defined on a second substrate or wafer, the mating structure on the second substrate or wafer being of a complementary shape to the mating structure on the first substrate or wafer; and (3) a bonding layer is disposed on at least one of said mating structures for bonding the mating structure defined on the first substrate or wafer to the mating structure on the second substrate or wafer.

6 Claims, 7 Drawing Sheets

U.S. PATENT DOCUMENTS

| | | | |
|---|---|---|---|
| 5,226,321 A | 7/1993 | Varnham et al. | 73/505 |
| 5,265,470 A | 11/1993 | Kaiser et al. | 73/178 R |
| 5,313,835 A | 5/1994 | Dunn | 73/505 |
| 5,354,985 A | 10/1994 | Quate | 250/234 |
| 5,475,318 A | 12/1995 | Marcus et al. | 324/762 |
| 5,659,195 A | 8/1997 | Kaiser et al. | 257/415 |
| 5,665,253 A | 9/1997 | Kubena et al. | 216/41 |
| 5,666,190 A | 9/1997 | Quate et al. | 355/71 |
| 5,729,074 A | 3/1998 | Shiomi et al. | 310/309 |
| 5,747,804 A | 5/1998 | Williams et al. | 250/338.1 |
| 5,883,387 A | 3/1999 | Matsuyama et al. | 250/306 |
| 5,894,090 A | 4/1999 | Tang et al. | 73/504.02 |
| 5,929,497 A | 7/1999 | Chavan et al. | 257/417 |
| 5,994,750 A | 11/1999 | Yagi | 257/415 |
| 6,075,585 A | 6/2000 | Minne et al. | 355/71 |
| 6,091,125 A | 7/2000 | Zavracky | 257/417 |
| 6,092,423 A | 7/2000 | Beardmore | 73/704 |
| 6,126,311 A | 10/2000 | Schuh | 374/21 |
| 6,174,820 B1 | 1/2001 | Habermehl et al. | 438/745 |
| 6,211,532 B1 | 4/2001 | Yagi | 257/40 |
| 6,229,190 B1 | 5/2001 | Bryzek et al. | 257/419 |
| 6,296,779 B1 | 10/2001 | Clark et al. | 216/66 |
| 6,337,027 B1 | 1/2002 | Humphrey | 216/2 |
| 6,563,184 B1 | 5/2003 | Kubena et al. | 257/419 |
| 6,580,138 B1 * | 6/2003 | Kubena et al. | 257/415 |

OTHER PUBLICATIONS

Kubena, R.L., et al., "A New Miniaturized Surface Micromachined Tunneling Accelerometer", IEEE Electron Device Letters, vol. 17, No. 6, pp. 306–308 (Jun. 1996).

Kubena, R.L., et al., "New miniaturized tunneling–based gyro for inertial measurement applications," *43rd Journal of Vacuum Science & Technology B (Microelectronics and Nanometer Structures*, vol. 17, No. 6, pp. 2948–2952 (Nov./Dec. 1999).

Motamedi, M.E., et al., "Tunneling Tip Engine for Microsensors Applications", *Materials and Device Characterization in Micromachining II–Proceedings of the SPIE*, Santa Clara, California, vol. 3875, pp. 192–199 (Sep. 1999).

Grade, John, et al., "Wafer–Scale Processing, Assembly, and Testing of Tunneling Infrared Detectors", Transducers '97, 1997 International Conference on Solid State Sensors and Actuators, *Chicage*, Jun. 16–19, pp. 1241–1244.

Kenny, T.W., et al., Micromachined Silicon Tunnel Sensor for Motion Detection, Appl. Physics Letter, vol. 58, No. 1, Jan. 7, 1991, pp. 100–102.

Yeh, et al., "A Low Voltage Bulk–Silicon Tunneling–Based Microaccelerometer", IEEE, 1995 pp. 23.1.1–23.1.4.

Grétillat, F., et al., "Improved Design of a Silicon Micromachined Gyroscope with Piezoresistive Detection and Electromagnetic Excitation," *IEEE Journal of Microelectromechanical Systems*, vol. 8, No. 3, pp 243–250 (Sep. 1999).

Zavracky, P.M., et al., "Design and Process Considerations For A Tunneling Tip Accelerometer," *J. Micromech. Microeng.*, vol. 6, No. 3, pp. 192–199 (Sep. 1996).

* cited by examiner

DUAL-WAFER TUNNELING GYROSCOPE AND AN ASSEMBLY FOR MAKING SAME

RELATED APPLICATIONS

This application is a divisional of prior U.S. patent application Ser. No. 10/223,874 filed on Aug. 19, 2002, which is divsional of prior U.S. patent application Ser. No. 09/629,679, filed on Aug. 1, 2000 (now U.S. Pat. No. 6,555,404). This invention is related to other inventions that are the subject of separate patent applications filed thereon. See: U.S. patent application Ser. No. 09/629,682, filed on Aug. 1, 2000 (now U.S. Pat. No. 6,580,138) entitled "A Single Crystal, Dual Wafer, Tunneling Sensor or Switch with Silicon on Insulator Substrate and a Method of Making Same," the disclosure of which is incorporated herein by reference, and a divisional application of that application, U.S. patent application Ser. No. 10/358,471, filed Feb. 4, 2003; U.S. patent application Ser. No. 09/629,684 filed Aug. 1, 2000 entitled "A Single Crystal, Dual Wafer, Tunneling Sensor and a Method of Making Same," the disclosure of which is incorporated herein by reference, and a divisional application of that application, U.S. patent application Ser. No. 10/429,988, filed May 6, 2003; U.S. patent application Ser. No. 09/629,680, filed on Aug. 1, 2000 (now U.S. Pat. No. 6,580,184) entitled "A Single Crystal, Dual Wafer, Tunneling Sensor or Switch with Substrate Protrusion and a Method of Making Same," the disclosure of which is incorporated herein by reference, and a divisional application of that application, U.S. patent application Ser. No. 10/370,124, filed Feb. 18, 2003; and U.S. patent application Ser. No. 09/629,683, filed on Aug. 1, 2000 entitled "A Single Crystal, Tunneling and Capacitive, Three Axes Sensor Using Eutectic Bonding and a Method of Making Same," the disclosure of which is incorporated herein by reference, and a divisional application of that application, U.S. patent application Ser. No. 10/639,289, filed Aug. 11, 2003.

TECHNICAL FIELD

The present invention relates to micro electro-mechanical (MEM) gyroscopes using dual wafers which are bonded together preferably eutectically.

BACKGROUND OF THE INVENTION

The present invention provides a new process of fabricating a single crystal silicon MEM gyroscopes using low-cost bulk micromachining techniques while providing the advantages of surface micromachining. The prior art, in terms of surface micromachining, uses e-beam evaporated metal that is patterned on a silicon dioxide ($SiO_2$) layer to form the control, self-test, and tip electrodes of a tunneling MEM sensor. A cantilevered beam is then formed over the electrodes using a sacrificial resist layer, a plating seed layer, a resist mold, and metal electroplating. Finally, the sacrificial layer is removed using a series of chemical etchants. The prior art for bulk micromachining has utilized either mechanical pins and/or epoxy for the assembly of multi-Si wafer stacks, a multi-Si wafer stack using metal-to-metal bonding and an active sandwiched membrane of silicon nitride and metal, or a dissolved wafer process on quartz substrates (Si-on-quartz) using anodic bonding. None of these bulk micromachining processes allow one to fabricate a single crystal Si cantilever (with no deposited layers over broad areas on the beam which can produce thermally mismatched expansion coefficients) above a set of tunneling electrodes on a Si substrate and also electrically connect the cantilever to pads located on the substrate. The fabrication techniques described herein provide these capabilities in addition to providing a low temperature process so that CMOS circuitry can be fabricated in the Si substrate before the MEMS sensors are added. Finally, the use of single crystal Si for the cantilever provides for improved process reproducibility for controlling the stress and device geometry.

MEM gyroscopes may be used in various military, navigation, automotive, and space applications. Space applications include satellite stabilization in which MEM technology can significantly reduce the cost, power, and weight of the presently used gyroscopic systems. Automotive air bag deployment, ride control, and anti-lock brake systems provide other applications for MEM gyroscopes and/or sensor. Military applications include low drift gyros.

BRIEF DESCRIPTION OF THE INVENTION

Briefly and in general terms, the presently disclosed technology related, in one aspect, to an assembly for making a MEM tunneling gyroscope therefrom. The assembly comprises a beam structure, and a mating structure defined on a first substrate or wafer; sense electrodes, and a mating structure defined on a second substrate or wafer, the mating structure on the second substrate or wafer being of a complementary shape to the mating structure on the first substrate or wafer; and a pressure/heat sensitive bonding layer disposed on at least one of said mating structures for bonding the mating structure defined on the first substrate or wafer to mating structur on the second substrate or wafer in response to the application of pressure/heat therebetween.

In another aspect, the presently disclosed technology relates to a tunneling gyroscope assembly comprising a beam structure, and a mating structure defined on a first substrate or wafer; at least one contact structure, and a mating structure defined on a second substrate or wafer, the mating structure on the second substrate or wafer being of a complementary shape to the mating structure on the first substrate or wafer; and a bonding layer is disposed on a least one of said mating structures for bonding the mating structure defined on the first substrate or wafer to the mating structure on the second substrate or wafer. The mating structures are joined one to another at the bonding layer.

In operation, a Coriolis force is produced normal to the plane of the device by oscillating the beam laterally across the substrate. The side drive electrodes are preferably fabricated with the cantilevered beam on the first substrate and are bonded to the second substrate at the same time that the cantilevered beam is attached. This provides for high alignment accuracy between the cantilevered beam and the side electrodes.

BRIEF DESCRIPTION OF THE FIGURES

FIGS. 1A through 6A depict the fabrication of a first embodiment of the cantilevered beam forming portion of a MEM gyroscope;

FIGS. 1B through 6B correspond to FIGS. 1A–6A, but show the cantilevered beam forming portion, during its various stages of fabrication, in plan view:

FIGS. 7A through 11A show, in cross section view, the fabrication of the base portion of the gyroscope;

FIGS. 7B through 11B correspond to FIGS. 7A–9A but show the fabrication process for the base portion in plan view;

DETAILED DESCRIPTION

Several embodiments of the invention will be described with respect to the aforementioned figures. The first embodiment will be described with reference to FIGS. 1A through 15. A second embodiment will be discussed with reference to FIGS. 16 through 18B. Further modifications are described thereafter.

The MEM gyroscope shown in the accompanying figures is not drawn to scale, but rather are drawn to depict the relevant structures for those skilled in this art. Those skilled in this art realize that these devices, while mechanical in nature, are very small and are typically manufactured using generally the same type of technology used to produce semiconductor devices. Thus a thousand or more devices might well be manufactured at one time on a silicon wafer. To gain an appreciation of the small scale of these devices, the reader may wish to turn to FIG. 15 which includes size information for the first embodiment of a MEM gyroscope utilizing the present invention. The figure numbers with the letter 'A' appended thereto are section views taken as indicated in the associated figure numbers with the letter 'B' appended thereto, but generally speaking only those structures which occur at and immediately adjacent the section are shown and not structures which are well behind the section. For example, in FIG. 2A, the portion of the mask 14 which forms the upper arm of the letter E shaped structure seen in FIG. 2B does not appear in FIG. 2A since it is located spaced from the plane where the section is taken; however, the opening 14-3 behind the section line which is used to help define one of the two side drive electrodes of the gyroscope is shown. The section views are thus drawn for ease of illustration.

Figure 1A:
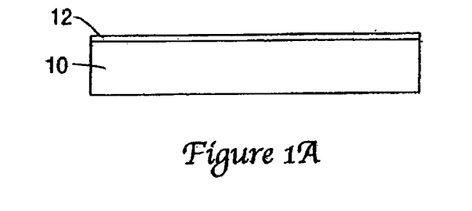
Figure 1B:
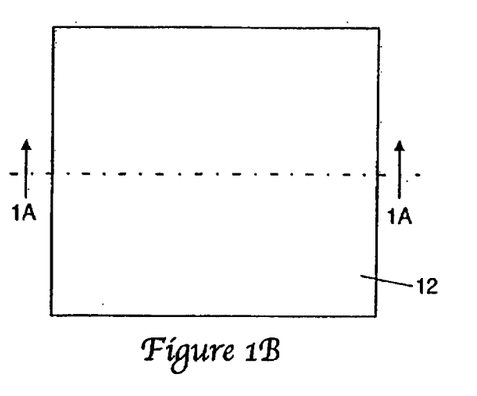

Turning to FIGS. 1A and 1B, a starting wafer for the fabrication of the cantilever is depicted. The starting wafer includes a wafer of bulk n-type silicon (Si) 10 upon which is formed a thin layer of doped p-type silicon 12. The silicon wafer 10 is preferably of a single crystalline structure having a <100> crystalline orientation. The p-type silicon layer 12 is preferably grown as an epitaxial layer on silicon wafer 10. The layer 12 preferably has a thickness of in the range of 1 to 20 micrometers ($\mu$m), but can have a thickness anywhere in the range of 0.1 $\mu$m to 800 $\mu$m. Generally speaking, the longer the cantilevered beam is the thicker the beam is. Since layer 12 will eventually form the cantilevered beam, the thickness of layer 12 is selected to suit the length of the beam to be formed.

Layer 12 in this embodiment is with Boron such that its resistivity is reduced to less than 0.05 $\Omega$-cm and is preferably doped to drop its resistivity to the range of 0.01 to 0.05 $\Omega$-cm. The resistivity of the bulk silicon wafer or substrate 10 is preferably about 10 $\Omega$-cm. Boron is a relatively small atom compared to silicon, and therefore including it as a dopant at the levels needed ($10^{20}$) in order to reduce the resistivity of the layer 12 tends to induce stress which is preferably compensated for by also doping, at a similar concentration level, a non-impurity atom having a larger atom size, such as germanium. Germanium is considered a non-impurity since it neither contributes nor removes any electron carriers in the resulting material.

Layer 12 shown in FIGS. 1A and 1B is patterned using well known photolithographic techniques to form a mask layer 14, patterned as shown, preferably to assume the shape of a capital letter 'E', with mesas 14-3, which will be used to help define side drive electrodes for the gyroscope. While the shape of the capital letter 'E' is preferred, other shapes can be used. In this embodiment, the outer peripheral portion of the E-shape will form a mating and supporting structure which will be used to join the cantilever portion of the sensor to the base portion and to support the cantilevered beam above the base portion.

Figure 2A:
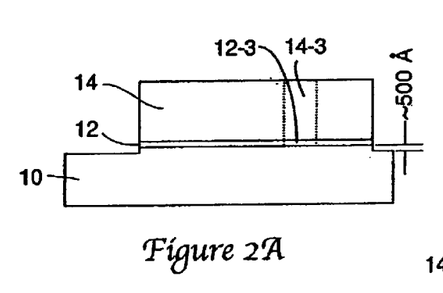
Figure 2B:
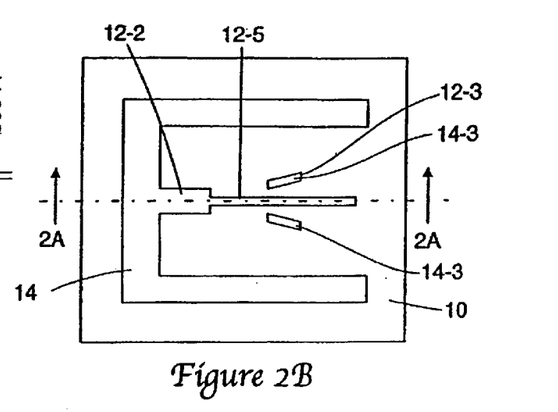

After the mask layer 14 has been patterned as shown in FIGS. 2A and 2B, the wafer is subjected to a plasma etch in order to etch through the exposed thin layer of p-type doped silicon 12 and also to over etch into the silicon wafer 10 by a distance of approximately 500 Å. This etching step defines the outer peripheral portion of the E-shape in layer 12, a cantilevered beam having a thick portion 12-2 and a thin elongated portion 12-5 as well as portions 12-3 of the side drive electrodes.

Figure 3A:
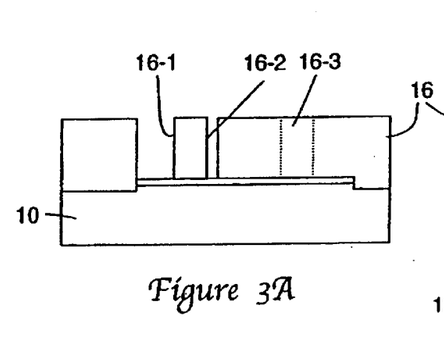
Figure 3B:
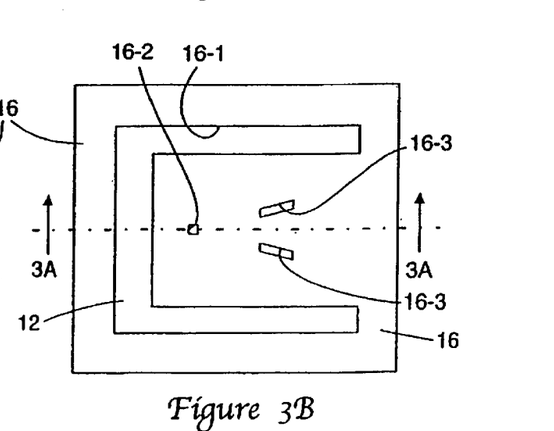

The mask 14 shown in FIGS. 2A and 2B is then removed and another photoresist layer 16 is applied, which is patterned as shown in FIGS. 3A and 3B by providing two openings therein 16-1, 16-2 plus two openings labeled 16-3 which align with the two small portions 12-3 of layer 12 which remain due to the aforementioned etching step. Opening 16-1 basically follows the outer perimeter of the 'E' shape of the underlying thin layer of p-type silicon 12 while opening 16-2 is disposed at or adjacent an end of the thick portion 12-2 (FIG. 4B) of the interior leg of the 'E'-shaped p-type silicon layer 12. The interior leg 12-2, 12-5 will become to the cantilevered beam.

Layers of Ti/Pt/Au are next deposited over mask 16 and through openings 16-1, 16-2 and 16-3 to form a post contact 18-1, a tunnelling tip contact 18-2 and two side drive electrode contacts 18-3. The Ti/Pt/Au layers preferably have a total thickness of about 2000 Å. The individual layers of Ti and Pt may have thicknesses in the ranges of 100–200 Å and 1000–2000 Å, respectively. After removal of the photoresist 16, the wafer is subjected to a sintering step at approximately 520° C. to form an ohmic Ti—Si juncture between contacts 18-1 and 18-2 and the underlying layer 12. As will be seen with reference to FIG. 19, the sintering step can be eliminated if a metal layer, for example, is used to connect contacts 18-1, 18-2 and 18-3.

As another alternative, which does rely on the aforementioned sintering step occurring, post contact 18-1 may be formed by layers of Ti and Au (i.e without Pt), which would involve an additional masking step to eliminate the Pt layer from post contact 18-1. However, in this alternative, the sintering would cause Si to migrate into the Au to form an Au/Si eutectic at the exposed portion of post contact 18-1 shown in FIGS. 4A and 4B. As a further alternative, the exposed portion of the post contact 18-1 shown in FIGS. 4A and 4B could simply be deposited as Au/Si eutectic, in which case the Pt layer in the post contact 18-1 could be optionally included. Post contact 18-1 may be eliminated if the subsequently described bonding between the cantilevered beam forming portion 2 and the base portion 4 occurs non-eutectically.

Figure 4A:
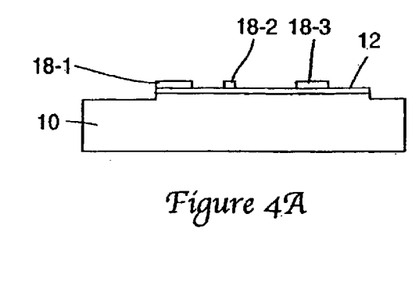
Figure 4B:
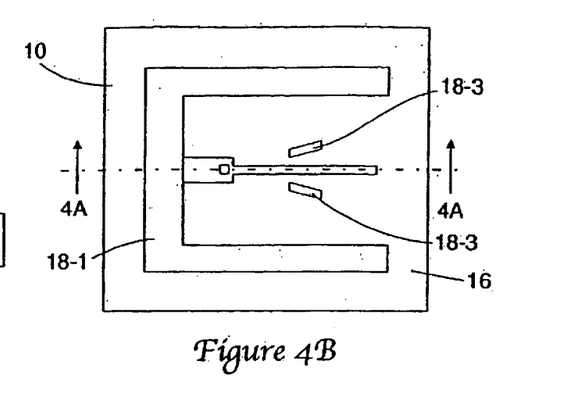

As a result, the exposed portion of the post contact 18-1 and the exposed portions 18-3 of the side drive electrodes 12-2, 18-3 shown in FIGS. 4A and 4B are formed preferably either by Au or by Au/Si. When the cantilevered beam forming portion 2 and the base portion 4 are mated as shown and described with reference to FIGS. 12 and 13 (and with reference to FIGS. 16 and 17 for a second embodiment), one of the exposed mating surfaces is preferably a Au/Si eutectic while the other is preferably Au. Thus, exposed mating surfaces 18-1, 18-3 can preferably be either Au and Au/Si if the exposed mating surface on the base portion 4 is the other material, i.e., preferably either Au/Si or Au so that a layer of Au/Si confronts a layer of Au.

Figure 5A:
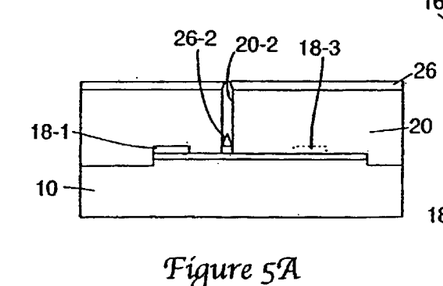
Figure 5B:
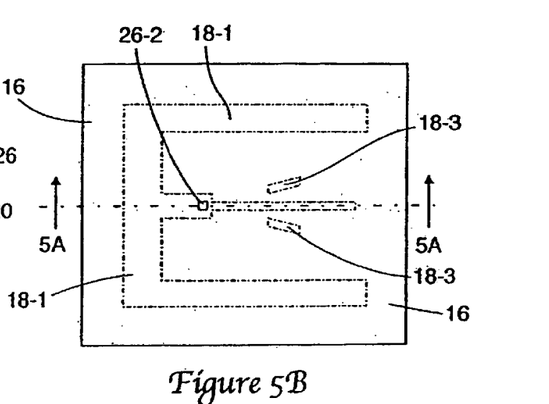

The structures shown in FIGS. 4A and 4B are then covered with a layer of photoresist 20 which, as shown in FIG. 5A, is patterned as shown in FIGS. 5A and 5B, with a opening 20-2 therein over tunnelling tip contact 18-1. Those skilled in the art will appreciate that the size of the openings 16-1, 16-2, 16-3 and 20-2 are not drawn to scale on the figures and that openings 16-2 and 20-2 would tend to be significantly smaller than would be openings 16-1 and 16-3-1. As such, when a rather thick layer of Au 26, preferably having a thickness of about 15,000 Å, is deposited on the wafer, it basically clogs opening 20-2 (see FIG. 5A). Those skilled in the art will appreciate that there is fill-in at the sides of a mask when a layer such as Au layer 26 is deposited because of an-increasing overhang which occurs at the edges of opening 20-2 as the deposition process proceeds. Since opening 20-2 is rather narrow, the deposited Au 26, as shown at numeral 26-2, assumes a pyramidal-like or conical-like shape as the opening is clogged with Au. The thickness of the deposition of Au layer 26 is sufficiently thick to assure that layer 26 will close across the top of opening 20-2 during the deposition process and so that structure 26-2 assumes its pointed configuration.

Figure 6A:
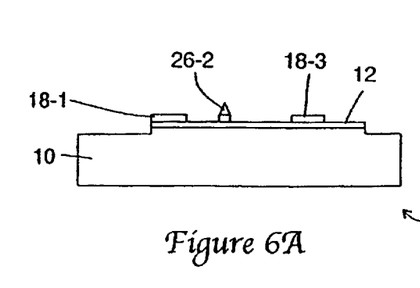
Figure 6B:
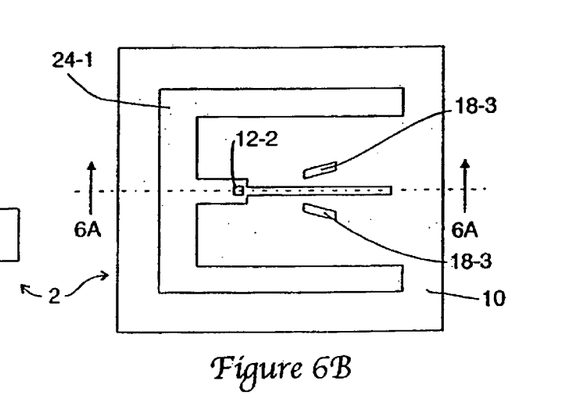

The photoresist 20 is then dissolved lifting off the layer 26 formed thereon and leaving the structures depicted by FIGS. 6A and 6B.

Figure 7A:
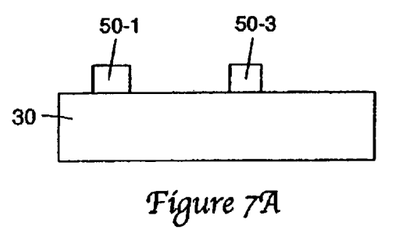
Figure 7B:
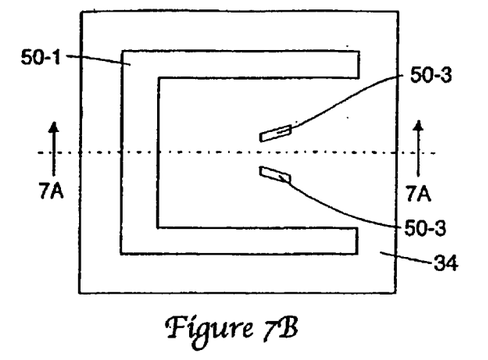
Figure 8A:
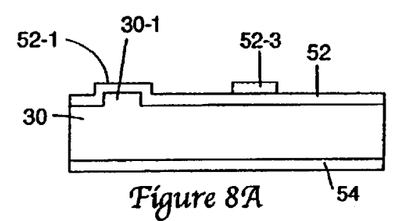
Figure 8B:
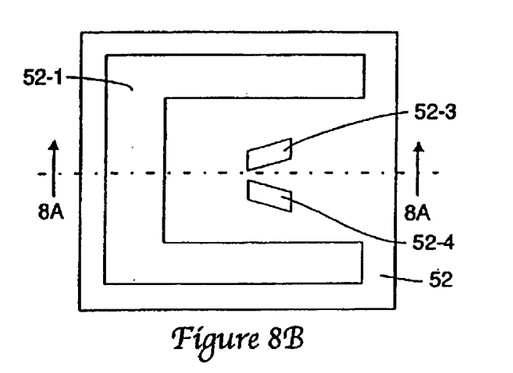

The fabrication of the base portion 4 (See FIG. 12) of this embodiment of the MEM gyroscope will now be described with reference to FIGS. 7A through 11B. Turning to FIGS. 7A and 7B, a wafer 30 of silicon is shown upon which a layer of photoresist has been deposited and patterned (i) to assume preferably the outer peripheral shape of a capital letter 'E' 50-1 complementary to the outer peripheral shape of patterned mask layer 14 (FIG. 2B) and (ii) to define mesas 50-3 complementary to the size, shape and location of the first portions 12-3, 18-3 of the side drive electrode formed on the cantilevered beam forming portion 2. The exposed silicon is then subjected to an etch, etching it back approximately 20,000 Å, to define a protruding portion 30-1 of wafer 30 under the patterned mask 50-1 of the photoresist and protruding portions 30-3 under mesas 50-3 The photoresist mask 50 is then removed and wafer 30 is oxidized to form layers of oxide 52, 54 on its exposed surfaces. The oxide layers are each preferably about 1 µm thick. Of course, the end surfaces shown in FIG. 8A are not shown as being oxidized because it is assumed that the pattern shown in FIG. 8A (and the other figures) is only one of a number of repeating patterns occurring across an entire wafer 30. The oxide includes protruding portions 52-1 and 52-3 thereof on protruding portions 30-1 and 30-3 of the wafer 30.

Figure 9A:
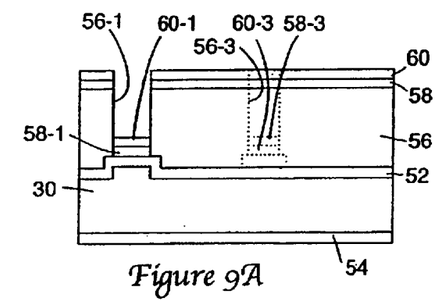
Figure 9B:
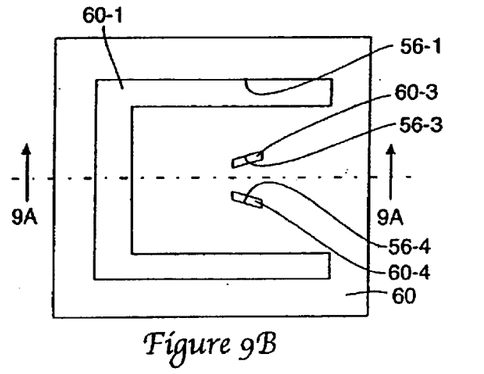

Turning to FIGS. 9A and 9B, a layer of photoresist 56 is applied having (i) an opening therein 56-1 which again assumes the outerperipheral shape of a capital letter 'E', as previously described and (ii) a pair of openings 56-3 to aid in the formation of the second portion of the side electrode on wafer 30. Then, a layer of Ti/Pt/Au 58, preferably having a thickness of 2,000 Å, is deposited through openings 56-1, 56-3 followed by the deposition of a layer 60 of an Au/Si eutectic preferably with a 1,000 Å thickness. Layers 58-1, 58-3 of Ti/Pt/Au and layers 60-1, 60-3 of the Au/Si eutectic are thus formed. Layers 58-1 and 60- preferably follow the outerperipheral shape of a capital letter 'E', as can be clearly seen in FIG. 9B, while layers 58-3 and 60-3 disposed on the oxidized protrusion 52-3 define the second portions of the side drive electrodes. The second portions of the side drive electrodes will be mated with the first portions thereof formed on cantilevered beam forming portion 2 in due course. Of course, if the post contact 18-1 and the side electrode contacts 18-3 (see FIG. 4A) are either formed of an Au/Si eutectic or has an Au/Si eutectic disposed thereon, then layers 60, 60-1, 60-3 may be formed of simply Au or simply omitted due to the presence of Au at the exposed layers 58-1 and 58-3.

Figure 10A:
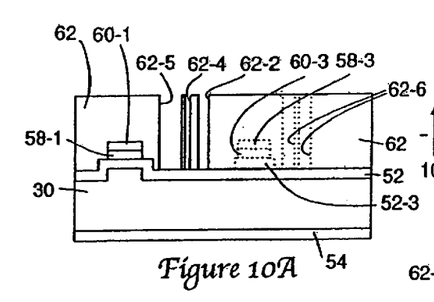
Figure 10B:
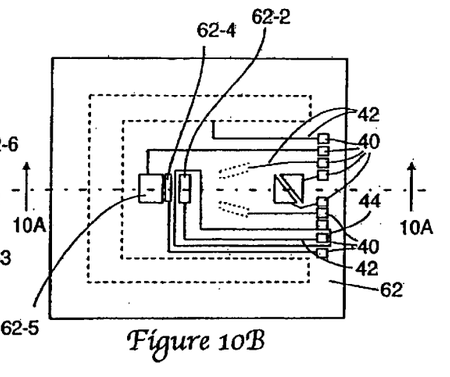
Figure 11A:
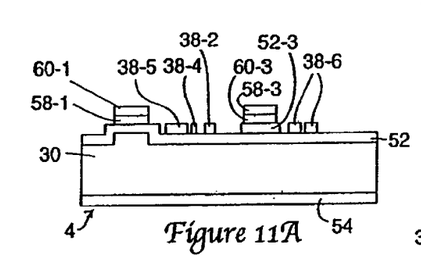
Figure 11B:
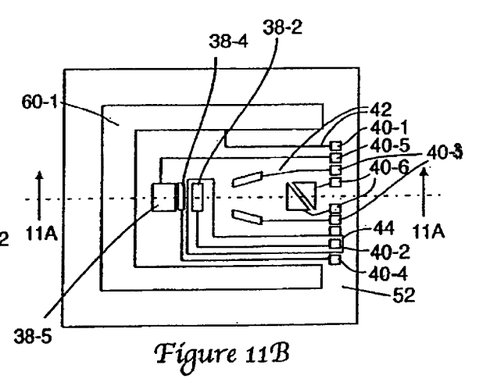

Photoresist layer 56 is then removed and a layer 62 of photoresist is applied and patterned to have (i) openings 62-2, 62-3, 62-4 and 62-6, as shown in FIG. 10A, (ii) openings for pads 40-1 through 40-5 and their associated ribbon conductors 42; (iii) an opening for guard ring 44 and its pad, as depicted in FIG. 10B. For the ease of illustration, the opening for guard ring 44 is not shown in FIG. 10A. A layer 38 of Ti/Pt/Au is then deposited over the patterned photoresist layer 62 and through openings 62-2, 62-3, 62-4 and 62-6 therein forming contacts 38-2, 38-3, 38-4 and 38-6 and the photoresist 62 is removed to thereby arrive at the structure shown in FIGS. 11A and 11B. Those contacts are interconnected with their associated pads 40-2 through 44-4 by the aforementioned ribbon conductors 42, which contacts 40 and ribbon conductors 42 are preferably formed at the same time as contacts 38-3, 38-4 and 38-2 are formed. The outerperipheral layers 58-1 and 60-1 are also connected with pad 40-1 by an associated ribbon conductor 42. The protrusion 30-1, which preferably extends approximately 20,000 Å high above the adjacent portions of wafer 30', and the relatively thin layers 58-1 and 60-1 form the mating structure for the base portion 4.

Contacts 38-6 are preferably triangularly shaped with their hypotenuses confronting each other and positioned such that the hypotenuses will lie under a centerline of the elongated cantilevered beam 12-5 when the cantilevered beam forming portion 2 is joined to the base portion 4.

Pad 40-1 is connected to layers 58-1 and 60-1 and provides a pad for a beam bias voltage. Pad 40-2 is connected to tip contact 38-2 and provides a pad for the tip contact 38-2. Pad 40-3 is connected to contacts 38-3 and provides a pad for the side drive electrodes 38-5, 58-3 and 60-3 (when the two portions 2, 4 are bonded together). Pad 40-4 is connected to contact 38-4 and provides a pad for device testing. Pad 40-5 is connected to contact 38-5 and provides a pad for a pull down voltage. Pads 40-6 are connected to the two side sense contacts 38-6 and provides pads for the side sense contacts 38-6.

Figure 12:
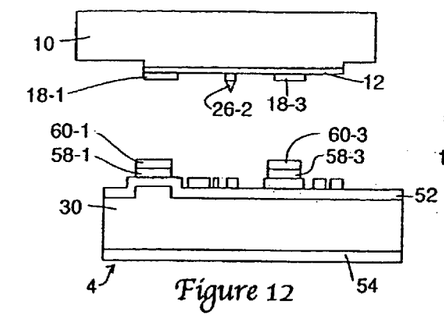
FIGS. 12 and 13 show the cantilevered beam forming portion and the base portion being aligned with each other and being bonded together preferably by eutectic bonding.

Turning to FIG. 12, the cantilevered beam forming portion 2 is now bonded to base portion 4. As is shown in FIG. 12, the two wafers 10 and 30 are brought into a confronting relationship so that their mating structures 18-1, 30-1, 58-1 and 60-1 are in alignment and so the first and second portions of the side drive electrode are in alignment and so that (i) layers 18-1 and 60-1 properly mate with each other and (ii) layers 18-3 and 60-3 properly mate with each other.

Figure 13:
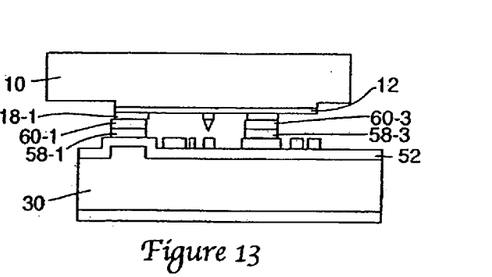
Figure 14A:
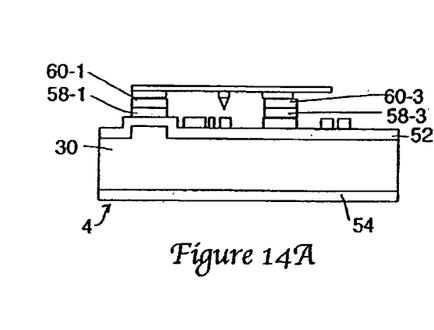
FIGS. 14A and 15 show the completed MEM gyroscope in cross sectional view, FIG. 15 being enlarged compared to FIG. 14A.
Figure 14B:
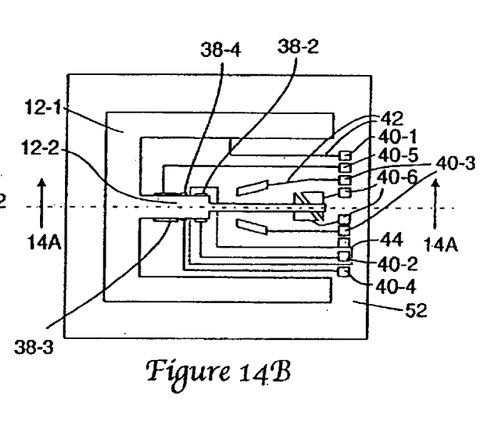
FIG. 14B shows the completed MEM gyroscope in plan view.

Pressure and heat (preferably by applying a force of 5,000 N at 400° C. between three inch wafers 2, 4 having 1000 sensors disposed thereon) are applied so that eutectic bonding occurs between layers 18-1 and 60-1 and between layers 18-3 and 60-3 as shown in FIG. 13. Thereafter, silicon wafer 10 is dissolved so that the MEM sensor structure shown in FIG. 14 is obtained. The p-type silicon layer 12 includes a portion 12-2 which serves as the cantilevered beam and another portion which is attached to the base portion 4 through the underlying layers. The gold contact 26-2 is coupled to pad 40-1 by elements 18-2, 12-2, 12-1, 18-1, 60-1, 58-1 and its associated ribbon conductor 42. If the bonding is done non-eutectically, then higher temperatures will be required.

Protrusion 30-1 and layers 18-1, 60-1, and 58-1 have preferably assumed the shape of the outerperpherial edge of a capital letter 'E' and therefore the cantilevered beam of the MEM gyroscope is well protected by this physical shape. After performing the bonding, silicon layer 10 is dissolved away to arrive at the resulting MEM sensor shown in FIGS. 14A and 14B. The silicon can be dissolved with ethylenediamine pyrocatechol (EDP). This leaves only the Boron doped silicon cantilevered beam 12 with its associated contact 26-2 and its supporting or mating structure 18-1 bonded to the base structure 4. Preferable dimensions for the MEM sensor are given on FIG. 15. The beam as preferably has a length of 200 to 300 $\mu$m (0.2 to 0.3 mm).

Figure 15:
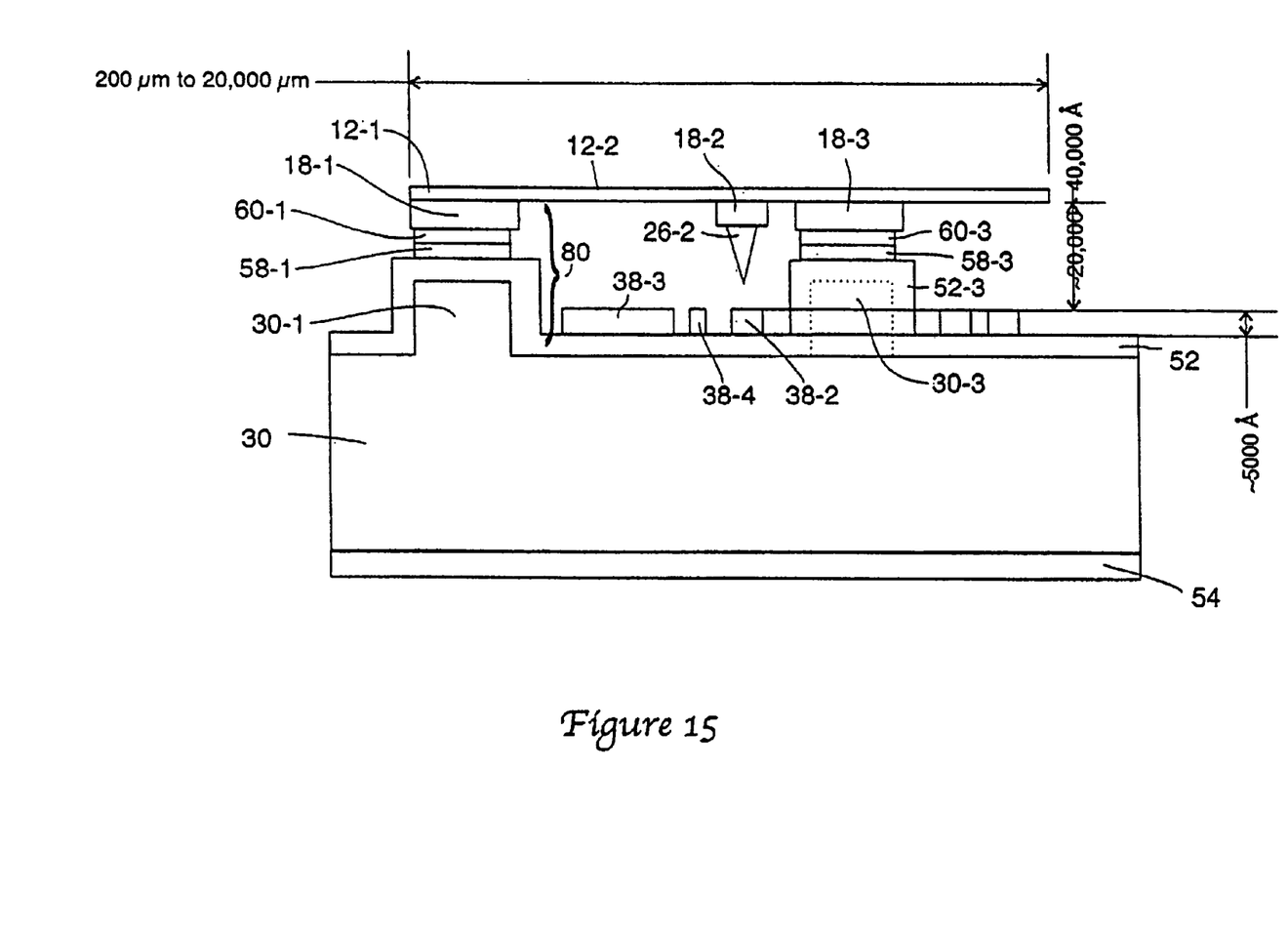
Figure 16:
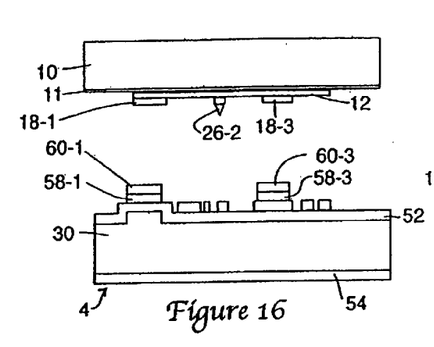
FIGS. 16 and 17 show a modification of the cantilevered beam forming portion wherein the beam is formed on an etch stop layer and also shown the base portion being aligned therewith and being bonded thereto preferably by eutectic bonding.
Figure 17:
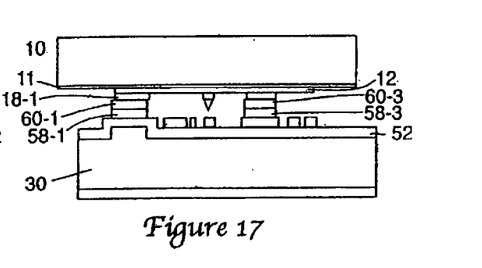
Figure 18A:
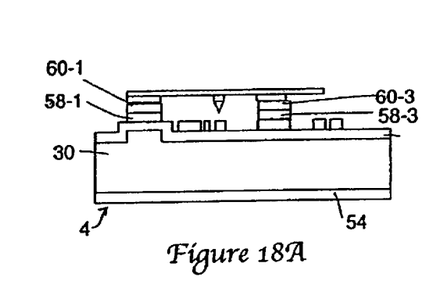
FIGS. 18A and 18b show the completed MEM gyroscope in cross sectional view and plan views.
Figure 18B:
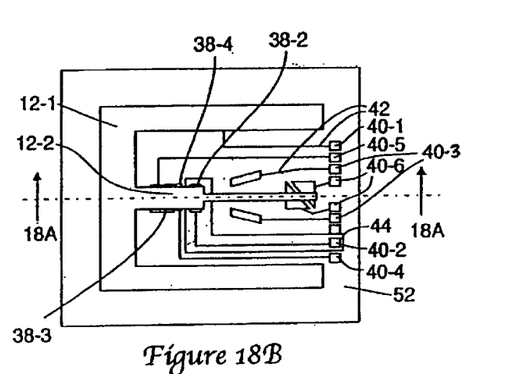

FIG. 15 is basically identical to FIG. 14, but shows the MEM sensor in somewhat more detail and the preferred dimensions of the MEM sensor are also shown on this figure.

Figure 19:
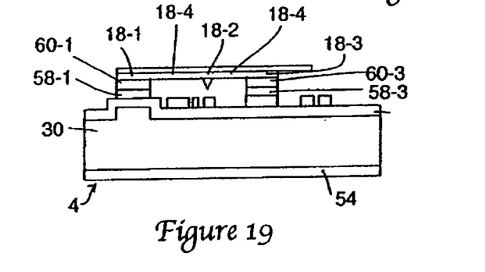
FIG. 19 shows a modification wherein a relatively small ribbon conductor is provided on the cantilevered beam.

Instead of using EDP as the etchant, plasma etching can be used if a thin layer 11 of $SiO_2$ is used, for example, as an etch stop between layer 12 and substrate 10. FIGS. 16, 17, 18A and 18B are similar to FIGS. 12, 13, 14A and 14B, respectively, but differ in that a thin layer of $SiO_2$ is shown being utilized as an etch stop between layer 12 and substrate 10. Such a thin layer 11 of $SiO_2$ can be formed by the implantation of oxygen so that layer 12 retains the same crystalline structure of wafer 10. In this case the layer 12 may be undoped or may be doped with Boron or other dopants. The plasma etch in this case is a two step process. A first etch, which preferentially etches silicon, removes substrate 10 and a second etch, which preferentially etches $SiO_2$, removes the etch stop layer 11 to arrive at the structure shown in FIGS. 18A and 18B. If layer 12 is undoped or nor sufficiently doped to provide proper conductivity (for example, to a level less than 0.05 $\Omega$-cm), then a thin ribbon conductor 18-4 should be affixed to layer 12 as shown in FIG. 19 to interconnect contacts 18-1, 18-2 and 18-3. Generally speaking, it is preferred to use the conductivity in the cantilevered beam, by sufficiently doping same, to interconnect contacts 18-1, 18-2 and 18-3 rather than a separate ribbon conductor 18-4 since the existence of a ribbon conductor on the beam 12 may interfere with its freedom of movement in response to acceleration events which a gyroscope should detect. If a ribbon conductor 18-4 is used, then is should be kept as small as practicable in both height and width to minimize its effect on the cantilevered beam. It will be recalled that in the embodiment of FIGS. 1A-15, that after the layer of Ti/Pt/Au 18 was applied forming contacts 18-1, 18-2 and 18-3, they were sintered in order to form an ohmic bond with Boron-doped cantilever 12. It was noted that sintering could be avoided by providing a ribbon conductor between the contacts. The just-described ribbon conductor 18-4 has the advantage of omitting any steps needed to form ohmic contacts with the beam.

It can be seen that the Si layer 12 formed on silicon wafer 10 may be (i) doped with Boron or (ii) may be either undoped or doped with other impurities. If doped with Boron, layer 12 is preferably formed by epitaxial growth. If layer 12 is either undoped or doped with other impurities, it is preferably formed by methods other than epitaxial growth on substrate 10 and a thin etch stop layer 11 is then preferably formed between the thin Si layer 12 and the silicon substrate or wafer 10. This configuration is called Silicon On Insulator (SOI) and the techniques for making an SOI structure are well known in the art and therefor are not described in detail herein. The etch stop layer 11, if used, is preferably a layer of $SiO_2$ having a thickness of about 1–2 $\mu$m and can then be made, for example, by the implantation of oxygen into the silicon wafer 10 through the exposed surface so as to form the etch stop layer 11 buried below the exposed surface of the silicon wafer 10 and thus also define, at the same time, the thin layer of silicon 12 adjacent the exposed surface. This etch stop layer 11 is used to release the cantilevered beam from wafer 10 by the aforementioned two step plasma etch process. If layer 12 is doped with Boron, it is doped to reduce the resistivity of the epitaxial layer 12 to less than 1 $\Omega$-cm. At that level of Boron doping the epitaxial layer 12 can resist a subsequent EDP etch used to release the cantilevered beam from wafer 10 and thus an etch stop layer is not needed. Preferably, the level of doping in layer 12 reduces the resistivity of layer 12 to less than 0.05 $\Omega$-cm.

The structures shown in the drawings has been described in many instances with reference to a capital letter 'E'. However, this shape is not particularly critical, but it is preferred since it provides good mechanical support for the cantilevered structure formed primarily by beam portion of layer 12. Of course, the shape of the supporting and mating structure around cantilever beam 12 can be changed as a matter of design choice and it need not form the perimeter of the capital letter 'E', but can form any convenient shape, including circular, triangular or other shapes as desired.

This description includes references to Ti/Pt/Au layers. Those skilled in the art will appreciate that this nomenclature refers to a situation where the Ti/Pt/Au layer comprises individual layers of Ti, Pt and Au. The Ti layer promotes adhesion, while the Pt layer acts as a barrier to the diffusion of Si from adjacent layers into the Au. Other adhesion layers such as Cr and/or other diffusion barrier layers such as a Pd could also be used or could alternatively be used. It is often desirable to keep Si from migrating into the Au, if the Au forms a contact, since if Si diffuses into an Au contact it will tend to form $SiO_2$ on the exposed surface and, since $SiO_2$ is a dielectric, it has deleterious effects on the ability of the Au contact to perform its intended function. As such, a diffusion barrier layer such as Pt and/or Pd is preferably employed between an Au contact and adjacent Si material. However, an embodiment is discussed wherein the diffusion barrier purposefully omitted to form an Au/Si eutectic.

The nomenclature Au/Si or Au—Si refers a mixture of Au and Si. The Au and Si can be deposited as separate layers with the understanding that the Si will tend to migrate at elevated temperature into the Au to form an eutectic. However, for ease of manufacturing, the Au/Si eutectic is preferably deposited as a mixture except in those embodiments where the migration of Si into Au is specifically relied upon to form Au/Si.

Many different embodiments of a MEM device have been described. Many more embodiments can certainly be envisioned by those skilled in the art based the technology disclosed herein. But in all cases the base structure 4 is united with the cantilevered beam forming structure 2 by applying pressure and preferably also heat, preferably to cause an eutectic bond to occur between the then exposed layers of the two structures 2 and 4. The bonding may instead be done non-eutectically, but then higher temperatures must be used. Since it is usually desirable to reduce and/or eliminate high temperature fabrication processes, the bonding between the two structures 2 and 4 is preferably done eutectically and the eutectic bond preferably occurs between confronting layers of Si and Au/Si.

In operation, the side electrodes are used to create a force on the cantilevered beam that then oscillates laterally across the substrate in response thereto. When the gyroscopic sensor is rotated about its axis (i.e. the axis of the cantilevered beam), a Coriolis force is produced normal to the plane of the substrate. This force is detected as an oscillating tunneling current by the control electrodes in a servo loop. The servo loop responds by oscillating the control electrode voltage for force rebalancing operation at the lateral resonant frequency of the cantilevered beam. The side drive electrodes are preferably fabricated with the cantilevered beam on the first substrate and are bonded to the second substrate at the same time that the cantilevered beam is attached. This provides for high alignment accuracy between the cantilevered beam and the side electrodes.

Having described the invention with respect to certain preferred embodiments thereof, modification will now suggest itself to those skilled in the art. The invention is not to be limited to the foregoing description, except as required by the appended claims.

What is claimed is:

1. A MEM tunneling gyroscope assembly comprising:
   (a) a beam structure and a mating structure defined on a first substrate or wafer;
   (b) at least one contact structure and a mating structure defined on a second substrate or wafer, the mating structure on the second substrate or wafer being of a complementary shape to the mating structure on the first substrate or wafer; and
   (c) a bonding layer is disposed on at least one of said mating structures for bonding the mating structure defined on the first substrate or wafer to the mating structure on the second substrate or wafer, the mating structures being joined one to another at said bonding layer.

2. A MEM tunneling gyroscope assembly as claimed in claim 1 wherein the first and second substrates or wafers are each formed of single crystal silicon.

3. A MEM tunneling gyroscope assembly as claimed in claim 2 wherein the crystalline structure of the silicon is <100>.

4. A MEM tunneling gyroscope assembly as claimed in claim 1 wherein the cantilevered beam structure is formed from an epitaxial layer of silicon on said first substrate or wafer, said epitaxial layer being doped with a dopant.

5. A MEM tunneling gyroscope assembly as claimed in claim 4 wherein the epitaxial layer is doped with Boron at a sufficient concentration to reduce the resistivity of the epitaxial layer to less than 0.05 Ω-cm.

6. A MEM tunneling gyroscope assembly as claimed in claim 4 further including first and second ohmic contacts on said epitaxial layer, said second ohmic contact being disposed near a distal end of the beam structure and said first ohmic contact forming the mating structure on the first substrate or wafer.

* * * * *